United States Patent [19]

Chisholm

[11] 4,265,508

[45] May 5, 1981

[54] INTERMEDIATE-WEB HELD TERMINAL PINS

[75] Inventor: William M. Chisholm, Midlothian, Va.

[73] Assignee: Western Electric Company, Inc., New York, N.Y.

[21] Appl. No.: 965,219

[22] Filed: Nov. 30, 1978

[51] Int. Cl.³ .......................................... H01R 13/40
[52] U.S. Cl. ............................ 339/221 R; 339/276 SF
[58] Field of Search ................ 339/220, 221, 276 SF; 428/596, 597

[56] References Cited

U.S. PATENT DOCUMENTS

| 2,811,702 | 10/1957 | Narozny | 339/220 R |
|---|---|---|---|
| 2,871,551 | 2/1959 | Harris | 339/276 SF |
| 3,157,454 | 11/1964 | Collins | 428/596 |
| 3,328,749 | 6/1967 | Kukla | 339/221 |
| 3,330,632 | 7/1967 | De Moor | 428/596 |
| 3,473,219 | 10/1969 | Randar et al. | 339/276 SF |
| 3,550,250 | 12/1970 | Cervenka et al. | 29/429 |
| 3,605,237 | 9/1971 | Bakermans | 29/203 D |
| 3,644,015 | 5/1972 | Bakermans | 29/625 |
| 3,671,917 | 6/1972 | Ammon et al. | 339/17 L |
| 3,676,926 | 7/1972 | Kendall | 29/625 |
| 3,769,679 | 11/1973 | Kendall | 29/203 B |
| 3,805,356 | 2/1973 | Serrano | 29/203 B |
| 3,899,305 | 8/1975 | Hilgers et al. | 29/193 |
| 3,946,477 | 3/1976 | Cobaugh et al. | 29/203 B |
| 4,035,047 | 7/1977 | Ammon | 339/17 C |
| 4,054,354 | 10/1977 | Unger | 339/276 SF |
| 4,087,906 | 5/1978 | Cobaugh et al. | 29/630 D |
| 4,111,518 | 9/1978 | Zurcher | 339/276 SF |

Primary Examiner—Joseph H. McGlynn
Attorney, Agent, or Firm—D. D. Bosben

[57] ABSTRACT

Terminal pins (18) in a terminal pin strip (16) are integrally interconnected by webs (22) located intermediate free insertion ends (18i) and free connector ends (18c) of the pins so that when the webs are severed to separate the terminal pins, the severing operation does not disrupt the integrity of smooth finished surfaces on the connector ends of the pins. Each terminal pin (18) also is formed with an intermediate push shoulder (18ps) for applying pressure on the pin to insert the pin into an aperture (20a) in a support structure, such as a printed wiring board (20), without damaging the connector end (18c) of the pin. Assembly of the terminal pins (18) into the printed wiring board (20), utilizing terminal pin strips (16) on respective supply reels (24), is accomplished with apparatus comprising a pair of pin transporter mechanisms (26), a pair of web-severing punch-and-die mechanisms (28), and a pin insertion mechanism 30.

16 Claims, 13 Drawing Figures

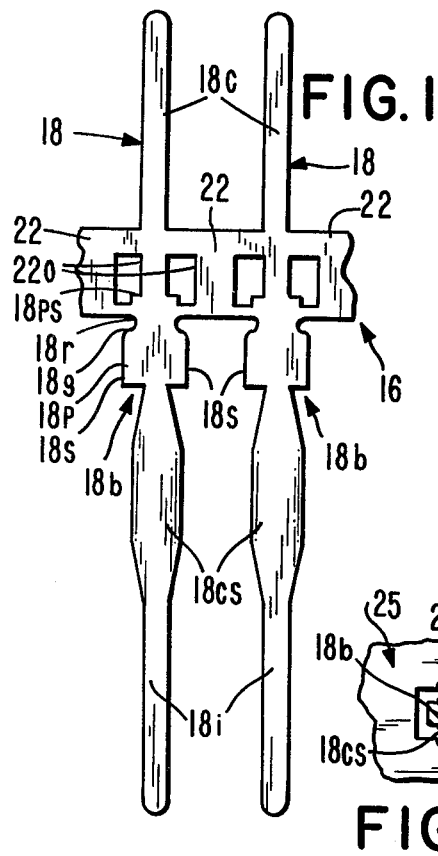
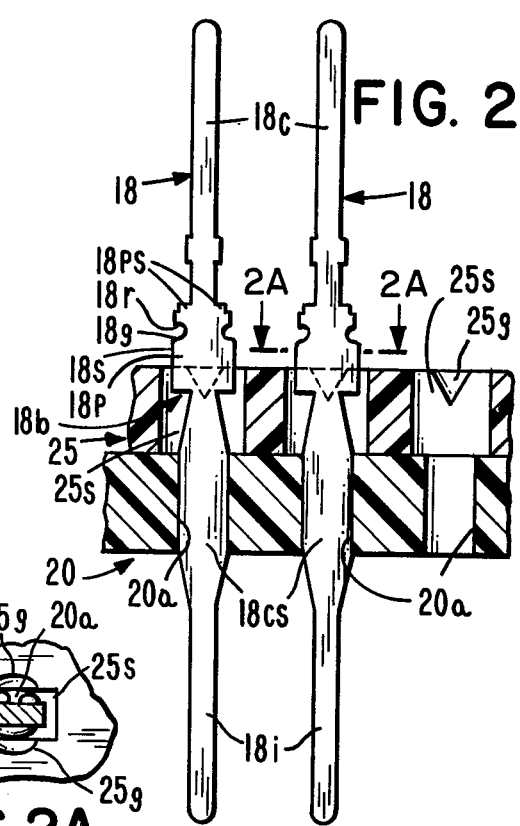
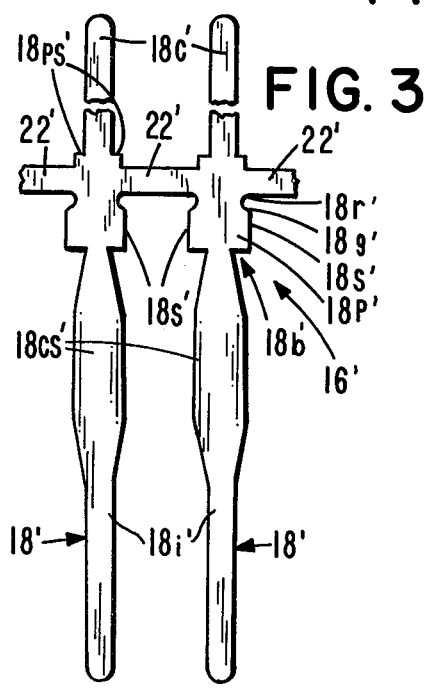
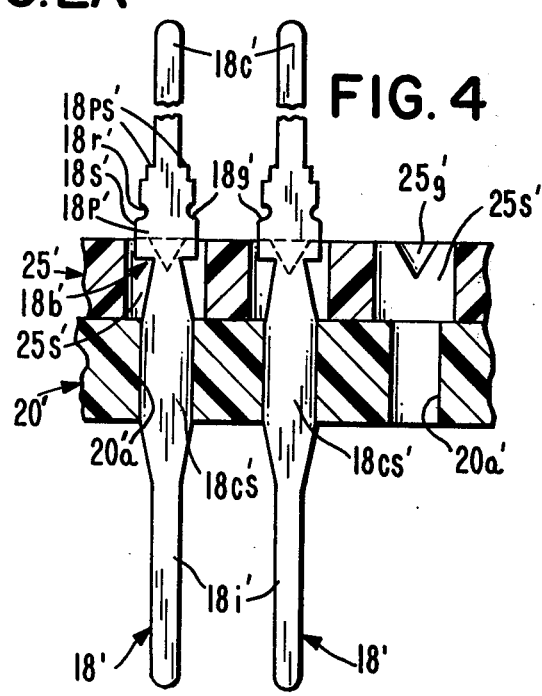

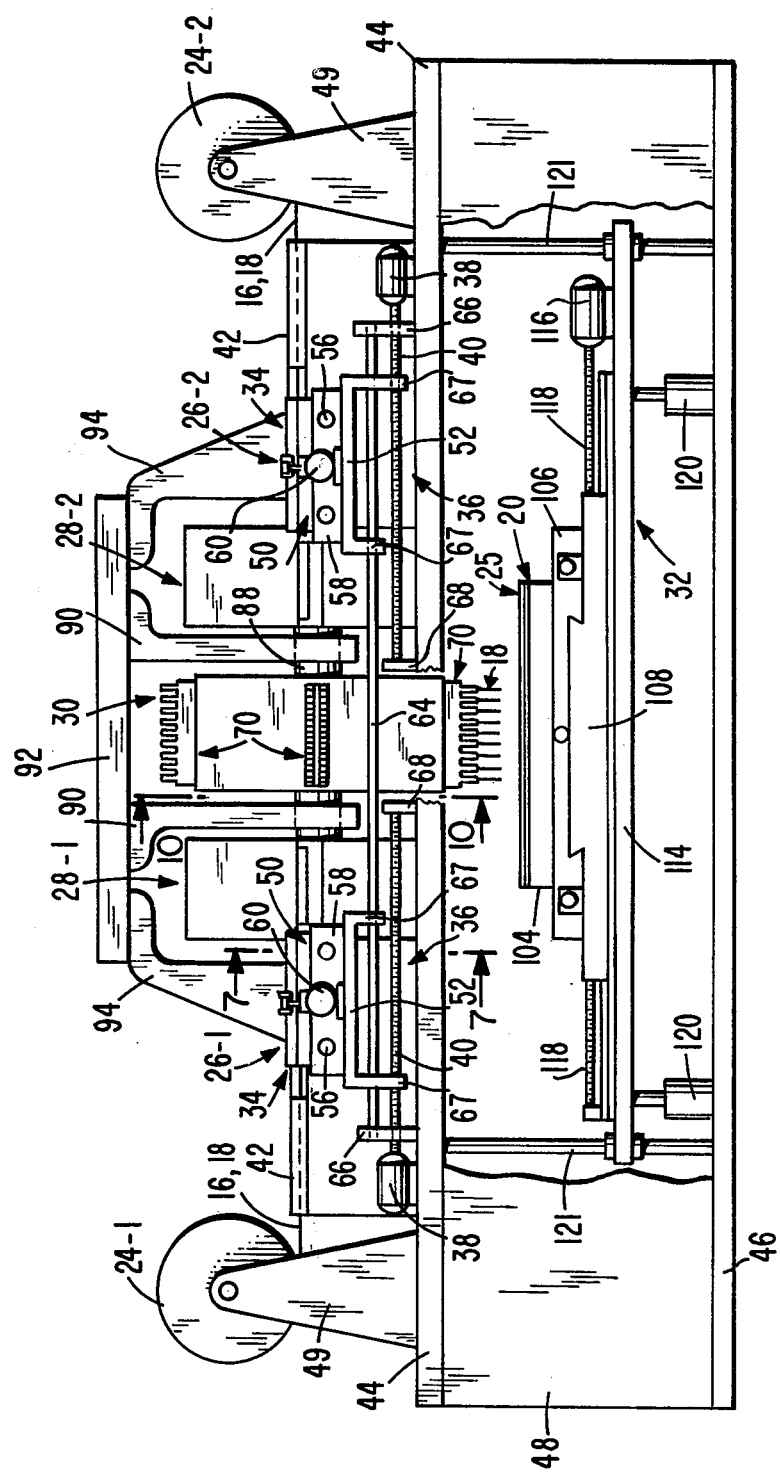

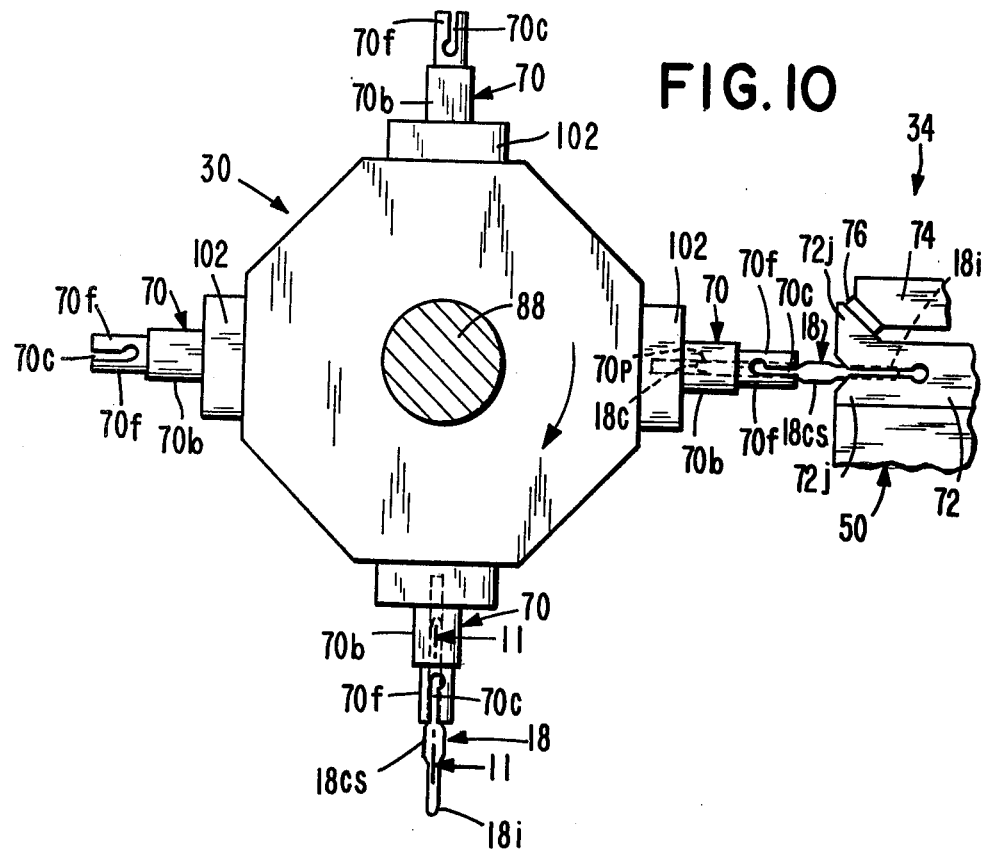
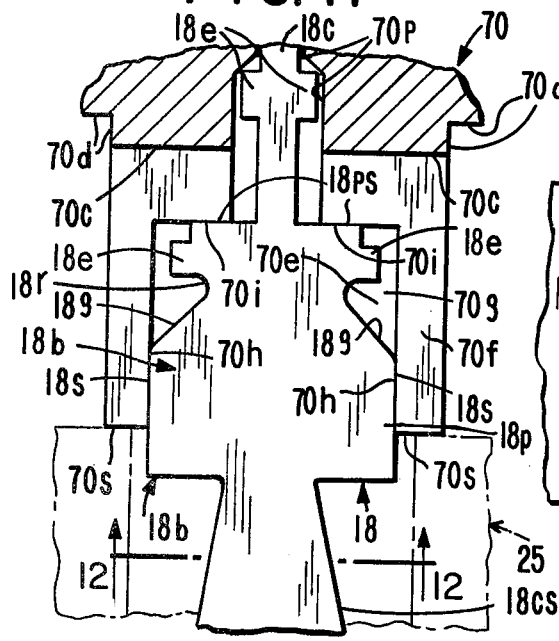
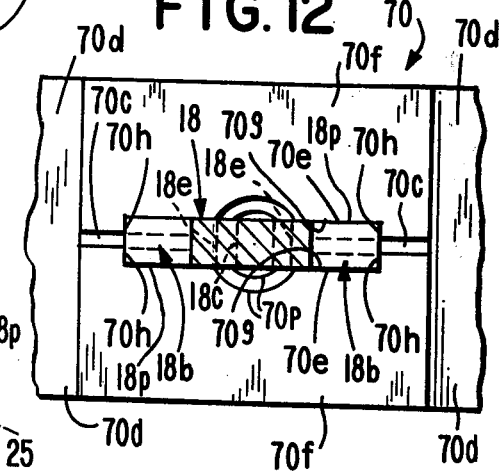

INTERMEDIATE-WEB HELD TERMINAL PINS

TECHNICAL FIELD

This invention relates to intermediate-web held terminal pins, and more specifically to intermediate-web held terminal pins which can be separated from one another and assembled to a support structure without disrupting the integrity of smooth finished surfaces on connector ends of the pins.

BACKGROUND OF THE INVENTION

In the manufacture of electronic communications apparatus it is standard practice to utilize elongated terminal pins formed with insertion ends which are inserted into a support structure, such as a printed wiring board, and opposite connector ends which subsequently are received in a connector device. For maximum use and versatility it is essential that the connector ends of the terminal pins maintain their structural integrity and provide a smooth finished surface for reception in the connector device. Thus, it is important that the connector ends of the terminal pins not be scratched, deformed or otherwise damaged during the assembly operation.

In the assembling of these terminal pins in apertures in a printed wiring board, it is known practice to insert the insertion ends of the pins into the apertures in the printed wiring board by exerting pressure on the connector ends of the pins. This is undesirable because the pressure on the connector ends of the terminal pins tends to damage these ends whereby they subsequently cannot be properly inserted in a connector device.

It also is known to form terminal pins from sheet stock in a parallel array with opposite ends of the terminal pins interconnected by opposed parallel side rails to form a terminal strip. In an assembling operation one of the side rails in separated from insertion ends of the terminal pins and the other side rail may be used as a pusher member to insert the separated ends into apertures in a printed wiring board. After the assembling operation, the second support rail is separated from connector ends of the terminal pins. In the alternative, the second support rail may be separated from the connector ends of the terminal pins before or after the insertion of the terminal pins into the printed wiring board, with the insertion of the terminal pins into the board being accomplished utilizing push shoulders formed on intermediate portions of the pins. In any event, either method is disadvantageous because the structural integrity of the connector ends of the terminal pins is damaged or destroyed when the side rails are separated from the pins, thus making the pins unacceptable for universal use.

The T. R. Harris U.S. Pat. No. 2,871,551 (FIG. 7) discloses a terminal pin strip in which terminal pins are interconnected adjacent respective ones of their ends by a removable side rail, and intermediate their ends by a strip member which may be utilized to provide an electrical connection between two or more adjacent terminal pins. In this regard, the strip member may be severed between adjacent terminals which are not to be electrically interconnected, as desired, at the same time that the ends of the terminals are separated from the side rail.

SUMMARY OF THE INVENTION

The subject invention relates to a terminal pin strip in which a plurality of webs are formed integrally with and between intermediate portions of associated adjacent pairs of terminal pins in the strip, with at least one push shoulder being formed integrally with the intermediate portion of each pin. Thus, the webs can be severed from the terminal pins, and the push shoulders can be utilized to insert the terminal pins in a support structure, without disrupting the integrity of smooth finished surfaces on connector ends of the pins.

The integrally formed webs may have openings formed therethrough which define the shoulders and which reduce the cross-sectional area of the webs adjacent the terminal pins to facilitate separation of the webs from the terminal pins. The terminal pins also may include blade portions having inclined guide surfaces merging into parallel side edges of the blade portions. In addition, the guide surfaces may merge into recessed edge portions of the blade portions which permit separation of the webs between the terminals without damaging the guide surfaces.

In assembling the terminal pins of the invention with a support structure, such as a printed wiring board, insertion ends of a plurality of the terminal pins of the terminal strip may be positioned in movement-confining portions of a pin transporter with the webs between the pins located externally of the pin transporter. The webs then are removed so that the terminal pins are retained individually in spaced relationship by the pin transporter. The pin transporter next is moved toward a pin inserter to insert connector ends of the terminal pins into movement-confining portions of the pin inserter, whereupon the pin transporter is withdrawn from the pins so that the pins are retained individually in spaced relationship by the pin inserter. Relative movement then is caused between the pin inserter and the support structure to insert the insertion end of each pin into one of the apertures in the support structure. During the insertion operation the pin inserter engages push shoulders on the terminal pins intermediate the insertion ends and the connector ends of the pins, so as to preclude damage to the connector ends of the pins.

More specifically, the pin transporter may comprise mechanisms movable in directions perpendicular to one another for advancing the terminal pins from a continuous supply into a punch-and-die mechanism for severing the webs from between adjacent pairs of the pins, and for positioning the connector ends of the severed pins in the movement-confining portions of the pin inserter. For this purpose the pin transporter may include a pivoted clamping bar for clamping the insertion ends of the plurality of the terminal pins simultaneously. Further, the pin inserter may be a turret rotatable between a terminal pin-receiving position and a terminal pin-inserting position. Terminal pin clamping fingers are mounted on the turret for receiving the connector ends of the terminal pins and include surfaces engageable with the push shoulders on the terminal pins for inserting the insertion ends of the pins into the apertures in the support structure.

BRIEF DESCRIPTION OF THE DRAWINGS

FIG. 1 is a view of a portion of a terminal pin strip in accordance with the invention;

FIG. 2 is a view similar to FIG. 1 showing terminal pins of FIG. 1 assembled in a printed wiring board;

FIG. 2A is a partial cross-sectional view taken along the line 2A—2A in FIG. 2;

FIG. 3 is an alternate embodiment of a portion of a terminal pin strip in accordance with the invention;

FIG. 4 is a view similar to FIG. 2 showing terminal pins of FIG. 3 assembled in a printed wiring board;

FIG. 5 is an elevational view of a terminal pin assembling apparatus in an initial operating condition;

FIG. 10 is an enlarged cross-sectional view of a portion of the apparatus taken along the line 10—10 in FIG. 5;

FIG. 11 is a cross-sectional view taken along the line 11—11 in FIG. 10; and

FIG. 12 is a cross-sectional view taken along the line 12—12 in FIG. 11.

DETAILED DESCRIPTION

Figure 6:
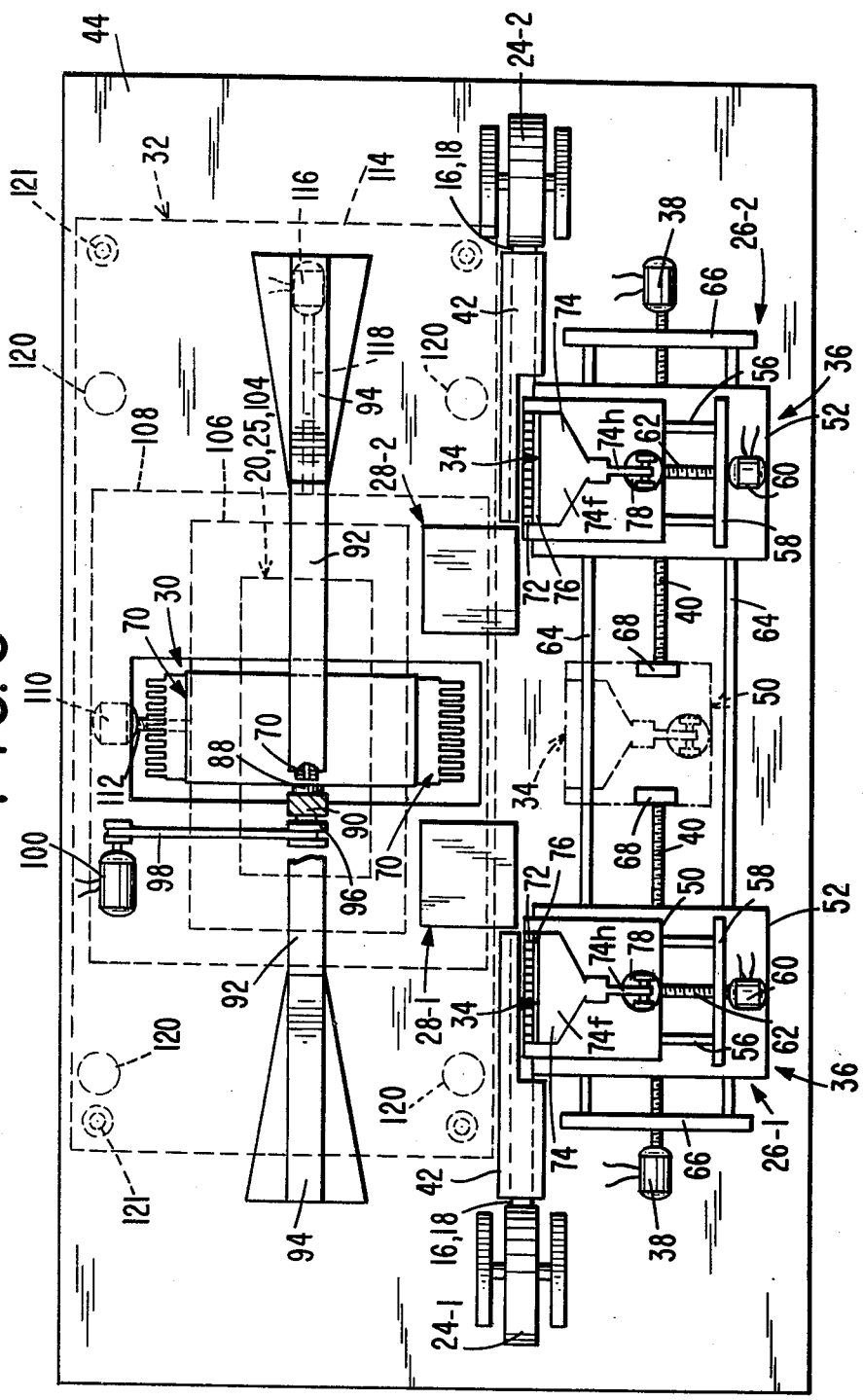
FIG. 6 is a plan view of the apparatus shown in FIG. 5.

Referring to FIGS. 1 and 2, a terminal pin strip 16 (FIG. 1) in accordance with this invention includes a plurality of elongated terminal pins 18 each having a body comprising a free insertion end portion 18i of square cross section, hereinafter referred to as the free insertion end, which has pairs of smooth finished parallel opposite side surfaces spaced apart uniformly along the entire length of the free insertion end, the free insertion end being receivable through a circular aperture 20a (FIG. 2) in a support structure 20, such as a printed wiring board. The body of each of the terminal pins 18 also includes a free connector end portion 18c of square cross section, hereinafter referred to as the free connector end, which has pairs of smooth finished surfaces spaced apart uniformly along the entire length of the free connector end, the free connector end being receivable in snug-fitting relationship in an electrical connector device, not shown. In this regard, as is apparent from FIGS. 1 and 2, the free insertion end 18i and the free connector end 18c of each terminal pin 18 each is in the form of an elongated stem extending in one direction from the body of the pin along a longitudinal axis of the pin, the elongated stem having a free unobstructed end defining an extremity of the pin. The bodies of the terminal pins 18 are linked together intermediate their free insertion ends 18i and their free connector ends 18c by webs 22 to form the terminal pin strip 16. The terminal pin strip 16 may be formed of any suitable material, such as a copper-nickel-tin alloy. Preferably, the terminal pins 18, including the free insertion ends 18i and the free connector ends 18c, are plated with a precious metal, such as gold, while the webs 22, which are subsequently discarded as scrap, are unplated.

In FIG. 1, the webs 22 are provided with prepunched openings 22o to reduce the cross-sectional area which must be sheared during a web severing operation, thus facilitating separation of the webs from the terminal pins 18. The openings 22o also define lateral projections which are formed integrally with a planar intermediate portion of each terminal pin 18 in the plane of the intermediate portion on opposite sides of the pin, and also formed integrally with lower portions of the pin-linking webs 22 extending between the lateral projections. The lateral projections include push shoulders 18ps on the planar intermediate portion of each of the terminal pins 18 in the plane of the intermediate portion, to facilitate insertion of the terminal pins into the apertures 20a of the printed wiring board 20, as shown in FIG. 2, without engaging and damaging the connector ends 18c of the pins.

Figure 9:
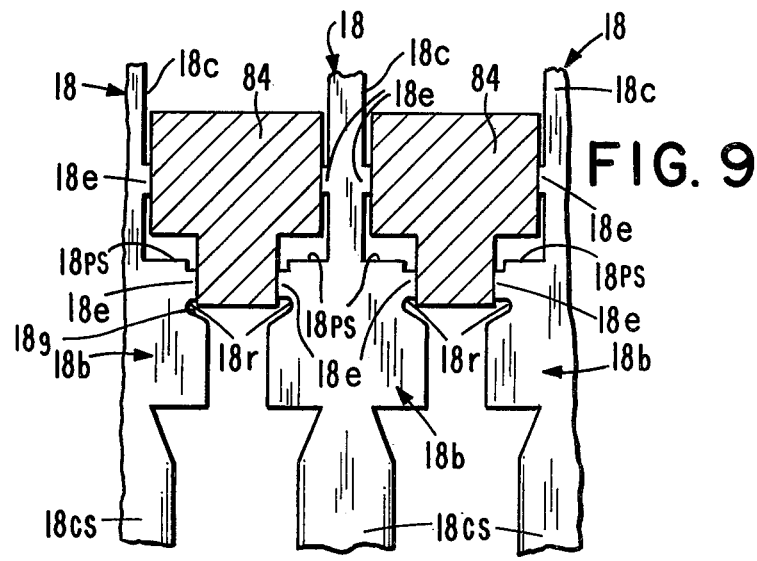
FIG. 9 is a cross-sectional view illustrating a web-removing step and taken along the line 9—9 in FIG. 7.

The terminal pins 18 preferably include intermediate compliant sections 18cs of a known type having an essentially U-shaped cross section (FIG. 2A) for retaining the terminal pins in the printed wiring board 20. The terminal pins 18 also include intermediate planar blade-type orienting or aligning portions 18b adjacent the webs 22, having opposite planar surfaces 18p and parallel side edges 18s. The blade-type orienting portions 18b also include inclined guide surfaces 18g merging into respective ones of the parallel side edges 18s and inclined outwardly from the body portions of their respective pins 18 in a direction sloping away from the free connector ends (stems) 18c of the pins. The guide surfaces 18g also merge into arcuate recessed edge portions 18r of the blade-type orienting portions 18b adjacent the webs 22, the recessed edge portions faciliating severing of adjacent sections of the webs between the terminal pins 18 without engaging and damaging the guide surfaces, as is best shown in FIG. 9. The side edges 18s and portions of the guide surfaces 18g of each terminal pin 18 are located laterally beyond respective ones of the opposite side surfaces of the free insertion end 18i and the free connector end 18c of the pin, and laterally beyond respective ones of the intermediate push shoulders 18ps, as is clearly shown in FIGS. 1, 2 and 11.

In the terminal pin insertion operation, a removable apertured plastic guide plate 25 may be suitably mounted over the printed wiring board 20, as illustrated in FIG. 2, to facilitate insertion of the compliant sections 18cs of the terminal pins 18 in the printed wiring board apertures 20a. By way of illustration, the guide plate 25 may include a series of terminal pin-receiving slots 25s with suitable guide surfaces, such as a pair of inverted conically-shaped guide grooves 25g (FIGS. 2 and 2A) located on opposite sides of each slot for guiding tips of the terminal pins 18 into alignment with the apertures 20a in the printed wiring board 20.

FIG. 3 discloses an alternate embodiment of a terminal pin strip 16' in accordance with the subject invention in which terminal pins 18' are interconnected by relatively thin strip-like webs 22', rather than by the relatively thick webs 22, with the prepunched openings 22o, of the terminal pin strip 16 of FIG. 1. In other respects, the terminal pin strip 16' of FIG. 3 is identical to the terminal pin strip 16 of FIG. 1. For example, the terminal pins 18' of FIG. 3 each include lateral projections which are formed integrally with a planar intermediate portion of the pin in the plane of the intermediate portion on opposite sides of the pin, and also formed integrally with the pin-linking webs 22', which extend between the lateral projections. The lateral projections include push shoulders 18ps' on the planar intermediate portion of the pin 18' in the plane of the intermediate portion to facilitate insertion of the pins into apertures 20a' of a printed wiring board 20', as shown in FIG. 4, without engaging and damaging connector ends 18c' of the pins. The terminal pins 18' of FIG. 3 also have insertion ends 18i', intermediate compliant sections 18cs' and intermediate planar blade-type orienting portions 18b' having opposite planar surfaces 18p' and inclined guide surfaces 18g' merging into respective parallel side edges 18s' and recessed edge portions 18r'.

In general, with reference to the terminal pin strip 16 of FIG. 1 by way of illustration, and referring to FIGS. 5 and 6, apparatus for assembling a plurality of the terminal pins 18 (FIGS. 1 and 2) into the printed wiring board 20 may include a pair of supply reels 24-1 and 24-2 (FIGS. 5 and 6) each having one of the terminal pins strips 16 mounted thereon. In an assembling operation the terminal pins 18 of the terminal pin strips 16 are fed alternately in sets from the supply reels 24-1 and 24-2 under the direction of a controller (not shown) by respective first and second pin transporter mechanisms 26-1 and 26-2 into associated punch-and-die mechanisms 28-1 and 28-2 for severing of the webs 22 (FIG. 1) from between the terminal pins. Each pin transporter 26-1 or 26-2 then transfers the severed terminal pins 18 to a pin insertion device 30 in the form of a rotatable turret. Upon withdrawal of the pin transporter 26-1 or 26-2 from the turret 30, the turret is rotated 90° to dispose the set of terminal pins 18 inserted therein by the pin transporter in a vertical orientation as shown in FIG. 5. The printed wiring board 20 then is moved upward by an X, Y, Z traversing mechanism 32 so that the terminal pins 18 are received in respective ones of the apertures 20a (FIG. 2) in the printed wiring board.

Since the pin transporter mechanisms 26-1 and 26-2 are essentially identical in construction and operation, only one is described herein, with like parts being identified by like reference numerals in the drawing. Thus, with reference to the first pin transporter mechanism 26-1 (FIGS. 5 and 6) by way of illustration, a set of the terminal pins 18 (FIG. 1) in the first terminal pin strip 16 extending from the first supply reel 24-1 initially is gripped by a clamping mechanism 34 of pin X-Y shuttle mechanism 36. The shuttle mechanism 36 then is driven to the right in FIGS. 5 and 6 by a reversible indexing motor 38 and a drive screw 40 to locate the set of terminal pins 18 in the punch-and-die mechanism 28-1, while simultaneously pulling additional terminal pins from the terminal pin strip 16 through a guideway 42 and into a clamping position for the next cycle of operation. The motor 38 and the guideway 42 are mounted on an elevated platform 44 supported above a base 46 (FIG. 5) by sidewalls 48 (FIG. 5) suitably secured to the platform and the base. Similarly, the associated supply reel 24-1 is rotatably mounted at the upper end of a stand 49 secured at its lower end to the platform 44.

Figure 7:
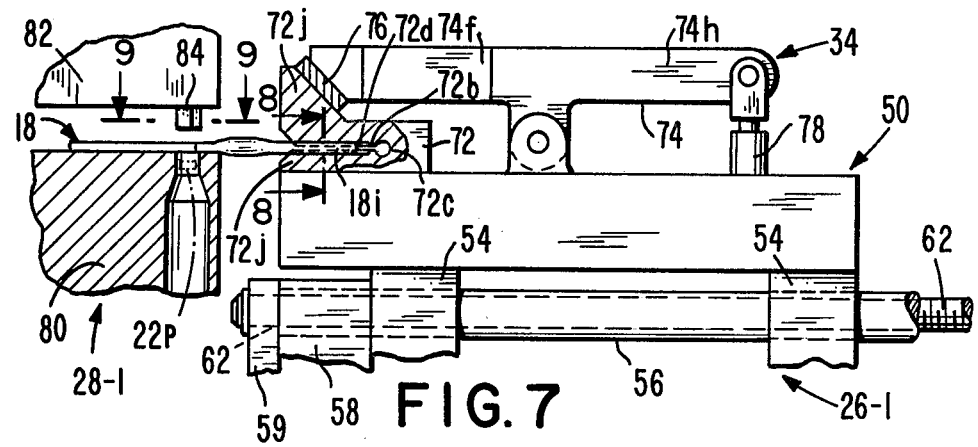
FIG. 7 is an enlarged cross-sectional view of a portion of the apparatus of FIGS. 5 and 6 in another operating condition, taken essentially along the line 7—7 in FIG. 5.

Referring to FIGS. 5, 6 and 7, the clamping mechanism 34 of the shuttle mechanism 36 is mounted on a Y-slide 50 of the shuttle mechanism. The Y-slide 50 is slidably supported for horizontal reciprocable movement on an X-slide 52 (FIGS. 5 and 6) of the shuttle mechanism 36 in a known manner by depending brackets 54 (FIG. 7) which slidably receive guide rods 56 fixedly supported at their opposite ends in upstanding brackets 58 (FIGS. 5, 6 and 7) on the X-slide. The Y-slide 50 is reciprocated by a reversible indexing motor 60 (FIGS. 5 and 6) mounted on the X-slide, 52, and a drive screw 62 (FIGS. 6 and 7) which extends through a drive bushing (not shown) in one of the depending brackets 54 (FIG. 7) on the Y-slide 50 and which is rotatably supported at an outer free end in an upstanding bracket 59 (FIG. 7) on the X-slide.

The X-slide 52 (FIGS. 5 and 6) of the shuttle mechanism 36 is slidably supported for horizontal reciprocable movement on a pair of spaced elongated guide rods 54 supported at their opposite ends in upstanding brackets 66 on the platform 44. The drive motor 38 also is mounted on the platform 44 and its associated drive screw 40 extends through an aperture in the adjacent bracket 66, and through a screw threaded drive bushing (not shown) in one of a plurality of depending legs 67 (FIG. 5) of the X-slide 52, with an end of the drive screw remote from the motor journalled in an upstanding bracket 68 secured at its lower end to the platform.

As is illustrated in FIGS. 7 and 9, after a set of the terminal pins 18 has been advanced into the punch-and-die mechanism 28-1 by the pin transporter mechanism 26-1, the punch-and-die mechanism severs the webs 22 between each adjacent pair of the terminal pins. The terminal pins 18 then are held individually in fixed spaced relationship by the clamping mechanism 34 (FIG. 7) on the shuttle mechanism 36.

The shuttle mechanism 36 next is driven by the X-slide motor 38 further to the right as viewed in FIGS. 5 and 6, to a position directly opposite (in front of) one of a plurality of clamping mechanisms 70 on the rotatable turret 30, whereupon the X-slide motor is de-energized. The Y-slide drive motor 60 then is energized to move the Y-slide 50, including the clamping mechanism 34 and the terminal pins 18 clamped therein, toward the opposed clamping mechanism 70 on the rotatable turret 30. Referring to FIG. 10, this movement of the shuttle clamping mechanism 34 then causes the connector ends 18c of the terminals 18 to be received in the turret clamping mechanism 70.

The shuttle clamping mechanism 34 then releases from the set of terminal pins 18 and the Y-slide drive motor 60 (FIGS. 5 and 6) is energized in a reverse direction to withdraw the Y-slide 50 and the clamping mechanism from the pins, leaving the pins held clamped in the clamping mechanism 70 on the rotatable turret 30. The drive motor 60 continues to cause retraction of the clamping mechanism 34 until it has reached a position as illustrated by broken lines in FIG. 6, which is outside its initial line of travel for advancing the terminal pins 18 to the right in this figure. The drive motor 60 then is de-energized and the X-slide drive motor 38 is energized in a reverse direction to drive the shuttle mechanism 36 to the left in FIGS. 5 and 6 until the clamping mechanism 34 is opposite (in front of) a new leading set of the terminal pins 18 of the terminal strip 16. The X-slide drive motor 38 now is de-energized and the Y-slide drive motor 60 again is energized to advance the Y-slide 50 and the clamping mechanism 34 toward the new leading set of terminal pins 18 so that these terminal pins can be clamped by the clamping mechanism as illustrated in FIG. 7.

Figure 8:
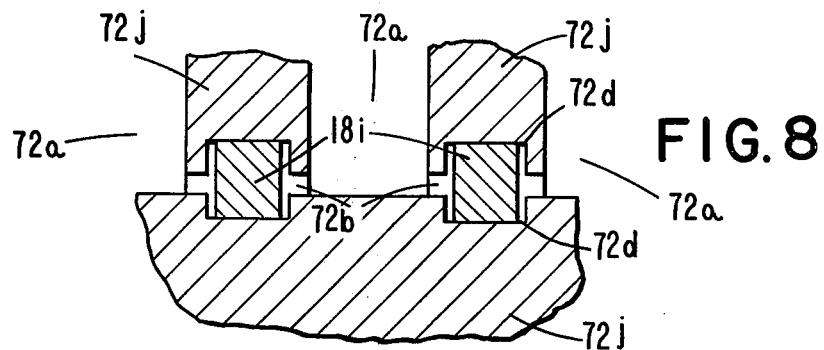
FIG. 8 is a cross-sectional view taken along the line 8—8 in FIG. 7.

Referring to FIG. 7, the shuttle clamping mechanism 34 includes a clamping member 72 fixedly mounted on the top of the Y-slide 50 at the lefthand end thereof as viewed in this figure. The clamping member 72 includes integral horizontally spaced upper resilient jaws 72j separated by vertical slots 72a (FIG. 8). Each of the upper clamping jaws 72j also is separated from an opposed lower fixed clamping jaw 72j by a slot 72b which terminates at an inner end in an enlarged circular portion 72c (FIG. 7) to increase the resiliency of the upper jaw in a known manner. As is best shown in FIG. 8, the opposed clamping jaws 72j also include elongated opposed slots 72d for the reception of the insertion ends 18i of the terminal pins 18.

Flexing of the upper resilient clamping jaws 72j of the clamping mechanism 34 toward the lower clamping jaw 72j to clamp the insertion ends 18i of the terminal pins 18 lightly between the upper jaws and the lower jaw so as to confine the pins against movement, is accomplished by a mechanism which includes an elongated bar member 74 pivoted intermediate its ends on the top of the Y-slide 50. As is best shown in FIG. 6, the bar member 74 includes a fan-shaped clamping portion 74f and an elongated handle portion 74h. At the lefthand end of the fan-shaped portion 74f of the operating bar 74, as viewed in FIG. 7, the operating bar is suitably bonded to an elongated resilient pad 76, which also is suitably bonded to the upper clamping jaws 72j and which is formed of a suitable resilient material, such as rubber.

At the opposite end of the operating bar 74 in FIG. 7, the handle portion 74h thereof in connected to an actuating air cylinder 78 mounted on the top of the Y-slide 50. When the air cylinder 78 is operated to pivot the operating bar 74 in a counterclockwise direction as viewed in FIG. 7, the upper resilient clamping jaws 72j are flexed toward the lower fixed clamping jaw 72j a slight amount, such as 10 mils, to clamp the insertion ends 18i of the terminal pins 18 between the jaws as shown in FIG. 8. When the air cylinder 78 is de-energized to pivot the operating bar 74 in a reverse clockwise direction as viewed in FIG. 7, the resilient upper clamping jaws 72j return to their initial positions with respect to the lower fixed clamping jaw 72j to release the terminal pins 18.

The punch-and-die mechanism 28-1 includes a lower fixed die member 80 (FIG. 7) and an upper vertically movable punch member 82 (FIG. 7) having a plurality of spaced depending punch elements 84 (FIGS. 7 and 9). When each set of the terminal pins 18 has been located between the punch-and-die members 80 and 82 by the associated pin-transporter mechanism 26-1, the punch member is operated vertically downward and the punch elements 84 sever the webs 22 (FIG. 1) between adjacent pairs of the terminal pins, from the terminal pins, as illustrated in FIG. 9. The web-severing operation inherently forms slightly projecting (e.g., 3 mils) ears 18e on the terminal pins, and the resultant severed web portions 22p (one shown in dashed lines in FIG. 7) then drop downward through a suitable discharge chute in the die member 80 to a discharge receptacle (not shown).

As is best shown in FIG. 5, the rotatable turret 30 is fixedly mounted on a horizontal shaft 88 rotatably mounted in the lower ends of a pair of depending brackets 90 suitably secured at their upper ends to a support plate 92. The support plate 92 is mounted at opposite ends on the upper ends of a pair of upstanding support posts 94 suitably secured at their lower ends to the platform 44. As is shown in FIG. 6, the lefthand end of the support shaft 88 is connected through a suitable drive clutch 96 and a drive chain 98 to an indexing drive motor 100 mounted on the platform 44.

Referring to FIG. 10, the terminal pin clamping mechanisms 70 on the rotatable turret 30 are suitably mounted on support blocks 102 on the turret at 90° intervals. Each turret clamping mechanism 70 may be in the form of an elongated plate member having a base portion 70b and a plurality of spaced parallel sets of opposed resilient clamping fingers 70f defined by an elongated slot 70c in the plate member and a plurality of laterally spaced slots 70d (FIGS. 11 and 12) between the resilient fingers.

Each pair of the opposed resilient clamping fingers 70f includes opposed slots 70e (FIGS. 11 and 12) for receiving the blade-type orienting portion 18b of one of the terminal pins 18 so as to confine the pin against movement, with the connector end 18c of the pin extending into a circular passageway 70p in the clamping mechanism 70 as illustrated in FIGS. 10, 11 and 12. In this connection, during the reception of the terminal pin 18 in the clamping fingers 70f, the inclined guide surfaces 18g of the pin, which project laterally beyond the adjacent ears 18e, the opposite planar side surfaces of the free connector end 18c, and the intermediate push shoulders 18ps, insure centering of the pin in the clamping finger slots 70e. Inner surfaces 70g and 70h of the clamping finger slots 70e then engage the planar surfaces 18p and the side edges 18s, respectively, of the blade portion 18b of the terminal pin 18, to further confine the pin against movement and to insure proper orientation of the pin during the subsequent insertion of the pin into the printed wiring board 20. Further, inner surfaces 70i (FIG. 11) of the slots 70e in the resilient fingers 70f engage the intermediate push shoulders 18ps of the terminal pin 18, which project laterally beyond respective ones of the opposite planar side surfaces of the free connector end 18c, for exerting a pushing force on the pin during the pin insertion operation.

As is shown in FIGS. 11 and 12, the circular passageway 70p includes first and second sections of different diameters for receiving the connector end 18c of the terminal pin 18 and an adjacent pair of the projecting ears 18e of the pin, respectively, with the planar side surfaces of the connector end spaced from the inner walls of the passageway as shown in FIG. 11. Preferably, however, the diameters of the passageway 70p are chosen so that the edges of a main portion of the connector end 18c of the terminal pin 18 and of the ears 18e of the pin are received in the passageway in closely spaced relationship, as illustrated in FIG. 12, to confine the terminal pin against lateral movement without damage to the planar side surfaces of the connector end.

Insertion of the terminal pins 18 received in each clamping mechanism 70 of the turret 30, into the respective ones of the apertures 20a (FIG. 2) in the printed wiring board 20 (FIGS. 2 and 5), is accomplished by indexing the turret 30 through 90° to a vertical position, as shown in FIG. 5. The printed wiring board 20 then is moved vertically upward so that the insertion ends 18i of the terminal pins 18 pass through respective ones of the slots 25s in the plastic guide plate 25 and through the apertures 20a in the printed wiring board until the compliant sections 18cs of the pins are received in the printed wiring board apertures with a force fit, as shown in FIG. 2. During this insertion operation, the inner surfaces 70i (FIG. 11) of the resilient turret clamping fingers 70f exert pressure on the push shoulders 18ps of the terminal pins 18 to force the pins into the apertures 20a (FIG. 2) in the printed wiring board without damaging the connector ends 18c of the pins. The terminal pins 18 are inserted into the printed wiring board apertures 20a (FIG. 2) until the plastic guide plate 25 engages outer stop surfaces 70s of the clamping fingers 70f as illustrated in FIG, 11, whereby the terminal pins are inserted into the printed wiring board 20 (FIG. 2) to a desired uniform depth. Then, since the friction force between the compliant sections 18cs of the terminal pins 18 and the walls of the apertures 20a in the printed wiring board 20 is greater than the gripping power of the clamping fingers 70f on the turret 30, when the printed wiring board is moved vertically downward the terminal pins are pulled by the printed wiring board from the clamping fingers.

The printed wiring board 20 and the guide plate 25 are supported on a stable 104 (FIGS. 5 and 6) in any suitable manner, not shown. The table 104 is fixedly mounted on a Y-slide 106 of the X, Y, Z traversing system 32. The Y-slide 106 is slidably mounted for horizontal movement along a guideway of an X-slide 108 and is driven by a motor 110 (FIG. 6) mounted on the X-slide and connected to the Y-slide by a drive screw 112. The X-slide 108 is mounted for horizontal movement along a guideway of a vertically movable platform 114, and is driven by a motor 116 mounted on the platform and connected to the X-slide by a drive screw 118. The platform 114 is vertically movable by four air cylinders 120 located adjacent the corners of the platform and mounted on the base plate 46, and is supported for vertical movement by suitable guide bushings and vertical guide rods 121 extending between the platform 44 and the base plate.

After one set of the terminal pins 18 has been inserted in the printed wiring board 20 from the supply reel 24-1 as above described, the Y-slide 106 and/or the X-slide 108 of the X, Y, Z traversing system 32 are indexed horizontally to locate a new set of the apertures 20a in the printed wiring board in position for reception of a set of the terminal pins 18. A next set of the terminal pins 18, from the supply reel 24-2 (righthand side of FIGS. 5 and 6), then is inserted into the positioned printed wiring board apertures 20a in a manner as above described. Subsequently, another set of the terminal pins 18 from the supply reel 24-1 is inserted into the printed wiring board 20, with sets of the terminal pins being alternately inserted into the printed wiring board from the supply reels 24-1 and 24-2 until a desired array of the pins has been inserted into the board.

INDUSTRIAL APPLICATION

In summary, the intermediate-web held terminal pins 18 (FIG. 1) or 18' (FIG. 3) readily can be assembled with a support structure, such as the printed wiring board 20 (FIG. 2) or 20' (FIG. 4) without disturbing the integrity of the smooth finished surfaces of the connector ends 18c or 18c' of the pins. This is accomplished by initially severing the intermediate webs 22 or 22' to separate the terminal pins 18 or 18', respectively, as illustrated in FIGS. 7 and 9 for the terminal pins 18. Since the intermediate webs 22 or 22' are not connected to the connector ends 18c or 18c', this severing operation has no effect on the integrity of the connector ends. Subsequently, pressure is exerted on the push shoulders 18ps or 18ps' of the pins 18 or 18', respectively, as illustrated in FIG. 11 for the terminal pins 18, to insert the pins into the printed wiring board 20 or 20' without engaging and damaging the connector ends of the pins.

In the disclosed method and apparatus for assembling terminal pins of the invention, and with reference to the insertion of the terminal pins 18 of FIG. 1 into the apertures 20a (FIG. 2) of the printed wiring board 20 (FIG. 2) by way of example, sets of the terminal pins are alternately inserted into the printed wiring board apertures from the supply reels 24-1 and 24-2 (FIGS. 5 and 6). By way of illustration, referring to the lefthand sides of FIGS. 5 and 6, the insertion ends 18i (FIG. 1) of a set of the terminal pins 18 extending from the supply reel 24-1 initially are clamped by the clamping mechanism 34 (best shown in FIG. 7) of the pin transporter mechanism 26-1. The X-slide 52 of the shuttle mechanism 36 of the pin transporter mechanism 26-1 then is driven to the right in FIGS. 5 and 6 so that the clamping mechanism 34 positions the clamped set of terminal pins 18 in the punch-and-die mechanism 28-1, while drawing a new set of the pins from the supply reel 24-1 into a clamping position. The webs 22 between the clamped set of terminal pins 18 then are severed from the pins by the punch-and-die mechanism 28-1 as illustrated in FIG. 9, whereupon the pins are retained individually in spaced relationship by the clamping mechanism 34.

The X-slide 52 then is driven further to the right in FIGS. 5 and 6 to locate the clamped set of terminal pins 18 in opposed alignment with one of the clamping mechanisms 70 on the rotatable turret 30. The Y-slide 50 of the shuttle mechanism 36 then is driven toward the turret 30 to insert the connector ends 18c of the clamped terminal pins 18 in the resilient clamping fingers 70f of the clamping mechanism 70 as illustrated in FIGS. 10, 11 and 12. The clamping mechanism 34 on the Y-slide 50 then is deactuated to release the insertion ends 18i of the terminal pins 18 and the Y-slide is retracted to withdraw the clamping mechanism from the pins so that the pins are retained individually in spaced relationship by the clamping fingers 70f. The Y-slide 50 and the X-slide 52 of the shuttle mechanism 36 then are operated to locate the clamping mechanism 34 in position for clamping the next set of the terminal pins 18 extending from the supply reel 24-1.

After one of the sets of the terminal pins 18 has been inserted in the clamping mechanism 70 on the turret 30 as above described, the turret is rotated 90° to position the terminal pins in vertical alignment with a respective set of the apertures 20a in the printed wiring board 20, as shown in FIG. 5. The printed wiring board 20 then is moved upward by the X, Y, Z traversing system 32 so that the insertion ends 18i of the terminals 18 pass through their respective slots 25s in the guide plate 25 and their respective apertures 20a in the printed wiring board, and so that the compliant sections 18cs of the pins are received in the printed wiring board apertures with a force fit, as shown in FIG. 2.

Referring to FIG. 11, during the pin insertion process the inner surfaces 70i of the clamping mechanism 70 on the turret 30 exert pressure on the push shoulders 18ps of the terminal pins 18 and the outer stop surfaces 70s of the clamping mechanism engage the guide plate 25, to achieve the desired insertion of the pins into the apertures 20a (FIG. 2) of the printed wiring board 20 to a uniform depth. Further, during the pin insertion process the inner surfaces 70g and 70h of the clamping mechanism 70 engage the planar surfaces 18p and the side edges 18s, respectively, of the terminal pins 18 to orient the pins and to confine the pins against movement. At the same time the edges of the connector ends 18c of the terminal pins 18 and the edges of the adjacent projecting ears 18e of the pins cooperate with the inner walls of the circular passageway 70p of the clamping mechanism, as illustrated in FIG. 12, so as to confine the pins against movement without damage to the planar side surfaces of the connector ends of the pins.

Subsequently, when the printed wiring board 20 is lowered to its initial position by the X, Y, Z traversing system 32, the terminal pins 18 are pulled from the clamping fingers 70f by the printed wiring board. The printed wiring board 20 then is indexed by operation of the X, Y, Z traversing mechanism 32 to locate a next set of the apertures 20a in the terminal pin-receiving position, and a set of the terminal pins from the supply reel 24-2 is inserted therein. This procedure, of alternately inserting sets of the terminal pins 18 in the printed wiring board apertures 20a from the supply reels 24-1 and 24-2, then is repeated until the desired array of pins has been inserted in the printed wiring board 20.

What is claimed is:

1. A terminal pin strip, which comprises:
a plurality of spaced elongated terminal pins;
each of the terminal pins including a body portion having an elongated stem extending in one direction from the body portion along a longitudinal axis of the terminal pin, the elongated stem having a free unobstructed end defining an extremity of the terminal pin, the body portion including a planar intermediate portion and the elongated stem having opposite essentially parallel side surfaces facing laterally in opposite directions away from each other and spaced apart essentially uniformly along the length of the stem in opposed spaced relationship to respective ones of the side surfaces of the elongated stems of adjacent terminal pins in the strip;
lateral projections formed integrally with the planar intermediate portion of each pin in the plane of the planar intermediate portion on opposite sides of the pin, at least one of the lateral projections including a shoulder which projects laterally beyond an adjacent one of the essentially parallel side surfaces of the elongated stem in the direction in which the one side surface faces laterally away from the other side surface; and
a plurality of pin-linking webs, each web being formed integrally with and extending between the lateral projections of the planar intermediate portions of an associated adjacent pair of terminal pins.

2. A terminal pin strip as recited in claim 1, in which:
the integrally formed webs have openings formed therethrough which define the shoulders and which reduce the cross-sectional area of the webs adjacent the terminal pins to facilitate separation of the webs from the terminal pins.

3. A terminal pin strip as recited in claim 1, in which:
each of the terminal pins includes an intermediate planar blade portion having parallel side edges on opposite sides of the blade portion and inclined guide surfaces merging into respective adjacent ones of the parallel side edges, the side edges and at least portions of the inclined guide surfaces of the intermediate planar blade portion being located laterally beyond respective ones of the opposite essentially parallel side surfaces of the elongated stem of the pin in respective ones of the directions in which the opposite side surfaces face laterally away from each other, with one of the side edges and a portion of the adjacent inclined guide surface also being located laterally beyond the shoulder of the pin in the direction of projection of the shoulder.

4. A terminal pin strip as recited in claim 3, in which:
the inclined guide surfaces of each terminal pin also merge into respective recessed edge portions of the blade portion of the pin adjacent the webs, the recessed edge portions facilitating severing of the webs between adjacent terminal pins without damaging the guide surfaces of the pin.

5. A terminal pin strip, which comprises:
a plurality of spaced elongated terminal pins;
each of the terminal pins including a body portion having an elongated stem extending in one direction from the body portion being a longitudinal axis of the terminal pin, the elongated stem having a free unobstructed end defining an extremity of the terminal pin and having opposite essentially parallel side surfaces facing laterally in opposite directions away from each other and spaced apart essentially uniformly along the length of the elongated stem in opposed spaced relationship to respective ones of the essentially parallel side surfaces of the stems of adjacent terminal pins in the strip;
each of the terminal pins also including an intermediate planar blade portion having guide surfaces inclined outwardly from the body portion in a direction sloping away from the elongated stem of the pin and projecting laterally beyond respective ones of the opposite essentially parallel side surfaces of the elongated stem of the pin in respective ones of the directions in which the side surfaces face laterally away from each other;
at least one shoulder formed integrally with the body portion of each terminal pin; and
a plurality of pin-linking webs, each web being formed integrally with and between the body portions of an associated adjacent pair of the terminal pins.

6. A terminal pin strip as recited in claim 5, in which:
the inclined guide surfaces of each terminal pin merge into respective recessed edge portions of the blade portion of the pin adjacent the webs, the recessed edge portions facilitating severing of the webs between adjacent terminal pins without damaging the guide surfaces of the pin.

7. A terminal pin strip as recited in claim 5, in which:
the body portion of each terminal pin with which the shoulder is integrally formed is of planar construction, with the shoulder being integrally formed with the planar body portion in the plane thereof and projecting laterally beyond an adjacent one of the essentially parallel side surfaces of the elongated stem of the pin in the direction in which the one side surface faces laterally away from the other side surface, and with an adjacent one of the inclined surfaces of the pin projecting laterally beyond the shoulder in the direction of projection of the shoulder.

8. A terminal pin strip as recited in claim 5, in which:
the intermediate planar blade portion of each terminal pin also includes parallel side edges on opposite sides of the blade portion and located laterally beyond respective ones of the opposite essentially parallel side surfaces of the elongated stem of the pin in respective ones of the directions in which the side surfaces face laterally away from each other, the inclined guide surfaces merging into respective ones of the parallel side edges.

9. A terminal pin strip as recited in claim 8, in which:
the inclined guide surfaces of each terminal pin merge into respective recessed edge portions of the blade portion of the pin adjacent the webs, the recessed edge portions facilitating severing of the webs between adjacent terminal pins without damaging the guide surfaces of the pin.

10. A terminal pin, which comprises:

a body portion having an elongated stem extending in one direction from the body portion along a longitudinal axis of the terminal pin, the elongated stem having a free unobstructed end defining an extremity of the terminal pin, the body portion including a first planar intermediate portion and the elongated stem having opposite essentially parallel side surfaces facing laterally in opposite directions away from each other and spaced apart essentially uniformly along the length of the stem;

a second planar intermediate portion having guide surfaces included outwardly from the body portion of the pin in a direction sloping away from the elongated stem of the pin and projecting laterally beyond respective ones of the opposite essentially parallel side surfaces of the elongated stem in respective ones of the directions in which the opposite side surfaces face laterally away from each other; and at least one shoulder formed integrally with the first planar intermediate portion in the plane thereof and projecting laterally beyond an adjacent one of the essentially parallel side surfaces of the elongated stem in the direction in which the one side surface faces laterally away from the other side surface, with an adjacent one of the inclined guide surfaces of the second planar intermediate portion projecting laterally beyond the shoulder in the direction of projection of the shoulder.

11. A terminal pin as recited in claim 10, in which:
the inclined guide surfaces of the second planar intermediate portion merge into respective inwardly recessed edge portions of the pin adjacent laterally projecting intermediate portions of the pin which have been severed from pin-carrying webs.

12. A terminal pin as recited in claim 10, in which:
the second planar intermediae portion also includes parallel side edges on opposite sides of the second planar intermediate portion and located laterally beyond respective ones of the opposite essentially parallel side surfaces of the elongated stem of the pin in respective ones of the direction in which the side surfaces face laterally away from each other, the inclined guide surfaces merging into respective ones of the parallel side edges.

13. A terminal pin as recited in claim 12, in which:
the inclined guide surfaces of the second planar intermediate portion merge into respective recessed edge portions of the pin adjacent laterally projecting intermediate portions of the pin which have been severed from pin-carrying webs.

14. A terminal pin, which comprises:
a body portion having an elongated stem extending in one direction from the body portion along a longitudinal axis of the terminal pin, the elongated stem having a free unobstructed end defining an extremity of the terminal pin, the body portion also having a first intermediate portion and the elongated stem having opposite essentially parallel side surfaces facing laterally in opposite directions away from each other and spaced apart essentially uniformly along the length of the stem;

second intermediate portions which have been severed from pin-carrying webs, projecting laterally from the first intermediate portion of the pin in respective ones of the direction in which the opposite essentially parallel side surfaces of the elongated stem face laterally away from each other;

an intermediate planar blade portion having guide surfaces inclined outwardly from the body portion of the pin in a direction sloping away from the elongated stem of the pin and projecting laterally beyond respective ones of the opposite essentially parallel side surfaces of the elongated stem and beyond the laterally projecting second intermediate portions in respective ones of the directions in which the opposite side surfaces face laterally away from each other, the inclined guide surfaces merging into respective inwardly recessed edge portions of the pin adjacent the laterally projecting second intermediate portions of the pin; and at least one shoulder formed integrally with the first intermediate portion of the pin body portion.

15. A terminal pin as recited in claim 14, in which:
the intermediate planar blade portion also includes parallel side edges on opposite sides of the blade portion and located laterally beyond respective ones of the opposite essentially parallel side surfaces of the elongated stem in respective ones of the directions in which the opposed side surfaces face laterally away from each other, the inclined guide surfaces of the blade portion merging into respective ones of the parallel side edges.

16. A terminal pin as recited in claim 14, in which:
the first intermediate portion of the terminal pin body portion is of planar construction, with the shoulder being integrally formed with the first intermediate portion in the plane thereof and projecting laterally beyond an adjacent one of the side surfaces of the elongated stem of the pin in the direction in which the one side surface faces laterally away from the other side surface, and with an adjacent one of the inclined guide surfaces of the intermediate planar blade portion projecting laterally beyond the shoulder in the direction of projection of the shoulder.

* * * * *

UNITED STATES PATENT AND TRADEMARK OFFICE
CERTIFICATE OF CORRECTION

PATENT NO. : 4,265,508
DATED : May 5, 1981
INVENTOR(S) : William Martin Chisholm It is certified that error appears in the above–identified patent and that said Letters Patent are hereby corrected as shown below:

In the specification, Column 1, line 40, "in" should read --is--. Column 5, line 61, first occurrence, the comma "," should be deleted. Column 6, line 1, "54" should read --64--. Column 7, line 18, "in" should read --is--. Column 9, line 7, "stable" should read --table--.

In the claims, Column 12, line 5, "being" should read --along--. Column 13, line 12, "included" should read --inclined--. Column 13, line 42, "direction" should read --directions--. Column 14, line 37, "opposed" should read --opposite--.

Signed and Sealed this

Twenty-sixth Day of January 1982

[SEAL]

Attest:

Attesting Officer

GERALD J. MOSSINGHOFF

Commissioner of Patents and Trademarks